(12) United States Patent
Zhou et al.

(10) Patent No.: US 12,035,593 B2
(45) Date of Patent: Jul. 9, 2024

(54) DISPLAY SUBSTRATE AND MANUFACTURING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Hongjun Zhou, Beijing (CN); Wen Tan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/922,146

(22) PCT Filed: May 21, 2021

(86) PCT No.: PCT/CN2021/095213
§ 371 (c)(1),
(2) Date: Apr. 18, 2023

(87) PCT Pub. No.: WO2021/238801
PCT Pub. Date: Dec. 2, 2021

(65) Prior Publication Data
US 2023/0247871 A1      Aug. 3, 2023

(30) Foreign Application Priority Data

May 29, 2020   (CN) ............................ 202010477245

(51) Int. Cl.
*H10K 59/131* (2023.01)
*G09G 3/3225* (2016.01)
*G09G 3/3266* (2016.01)

(52) U.S. Cl.
CPC ......... *H10K 59/131* (2023.02); *G09G 3/3225* (2013.01); *G09G 3/3266* (2013.01);
(Continued)

(58) Field of Classification Search
CPC ......... G09G 2300/0408; G09G 3/3225; G09G 2310/0297; G09G 3/3266;
(Continued)

(56) References Cited

U.S. PATENT DOCUMENTS

2007/0091218 A1* 4/2007 Huang ............... G02F 1/136204
349/40
2016/0155408 A1* 6/2016 Lee ..................... H01L 27/0296
345/211
(Continued)

FOREIGN PATENT DOCUMENTS

CN        103296020 A      9/2013
CN        103926719 A      7/2014
(Continued)

*Primary Examiner* — Muhammad N Edun
(74) *Attorney, Agent, or Firm* — IPro, PLLC (57) ABSTRACT

A display substrate and a manufacturing method therefor, and a display device. The display substrate includes a display region and a non-display region surrounding the display region, the non-display region includes a wire having a corner; and the display substrate further includes at least one electrostatic protection circuit, the electrostatic protection circuit is electrically connected with the wire at the corner, and the electrostatic protection circuit is configured to eliminate static electricity generated at the corner.

20 Claims, 8 Drawing Sheets

(52) U.S. Cl.
CPC .............. *G09G 2300/0408* (2013.01); *G09G 2310/0297* (2013.01); *G09G 2320/045* (2013.01); *G09G 2330/12* (2013.01)

(58) Field of Classification Search
CPC ......... G09G 2320/045; G09G 2330/12; G09G 2300/0426; G09G 2330/04; H10K 59/131; H10K 59/1201; H01L 27/0248
See application file for complete search history.

(56) References Cited

U.S. PATENT DOCUMENTS

| | | |
|---|---|---|
| 2016/0181257 A1 | 6/2016 | Liaw |
| 2016/0190119 A1 | 6/2016 | Hwang et al. |
| 2018/0046286 A1* | 2/2018 | Zhou ..................... G06F 3/041 |
| 2019/0189075 A1 | 6/2019 | Kim |
| 2020/0006449 A1* | 1/2020 | Yu ........................ H10K 77/111 |
| 2020/0373371 A1* | 11/2020 | Liu ..................... H10K 59/124 |

FOREIGN PATENT DOCUMENTS

| | | |
|---|---|---|
| CN | 107180593 A | 9/2017 |
| CN | 108519707 A | 9/2018 |
| CN | 109377874 A | 2/2019 |
| CN | 110085118 A | 8/2019 |
| CN | 110379822 A | 10/2019 |
| CN | 111599847 A | 8/2020 |
| KR | 20160082797 A | 7/2016 |

\* cited by examiner

Fig. 11

DISPLAY SUBSTRATE AND MANUFACTURING METHOD THEREFOR, AND DISPLAY DEVICE

CROSS REFERENCE TO RELATED APPLICATIONS

The present disclosure is a national phase entry under 35 U.S.C § 371 of International Application No. PCT/CN2021/095213, filed May 21, 2021, which claims the priority to China Patent Application No. 202010477245.9, filed to the China National Intellectual Property Administration on May 29, 2020 and entitled "DISPLAY PANEL AND MANUFACTURING METHOD THEREFOR, AND DISPLAY DEVICE", which is incorporated in its entirety herein by reference.

FIELD

The present disclosure relates to the technical field of display, in particular to a display substrate and a manufacturing method therefor, and a display apparatus.

BACKGROUND

Compared with a traditional liquid crystal display (LCD), an organic light-emitting diode (OLED) has been put into use in numerous fields of smart phones, wearable devices, notebooks, televisions (TV) and virtual reality (VR) devices at present on account of self-light-emission, wide color gamut, high contrast, thinness, etc. A wide variety of special-shaped screens, such as full screens, notch screens, water-drop notch screens, round wearable watches, and car special-shaped screens have emerged.

The special-shaped screens have a shape of an unconventional rectangle, resulting in corners during wiring in non-display areas and further inevitable electrostatic damage at the corners.

SUMMARY

Embodiments of the present disclosure provide a display substrate. The display substrate includes a display area and a non-display area surrounding the display area, where the non-display area includes a wire having corner; and the display substrate further includes at least one electrostatic protection circuit, where the electrostatic protection circuit is electrically connected with the wire at the corner, and the electrostatic protection circuit is configured to eliminate static electricity generated at the corners.

Optionally, the electrostatic protection circuit includes at least one of: a first electrostatic protection circuit configured to eliminate the static electricity generated at the corner using a filter technology; or a second electrostatic protection circuit configured to eliminate the static electricity generated at the corner according to a voltage regulation principle.

Optionally, the first electrostatic protection circuit includes a resistor-capacitor filter circuit, and the resistor-capacitor filter circuit is configured to eliminate the static electricity generated at the corner using a resistor-capacitor filter technology.

Optionally, the resistor-capacitor filter circuit includes at least one resistor and at least one capacitor; and a first end of the resistor is electrically connected with the wire at the corner, a second end of the resistor is electrically connected with a first end of the capacitor, and a second end of the capacitor is floating or grounded.

Optionally, the first electrostatic protection circuit includes a first electrode layer, a first dielectric layer and a first semiconductor layer; and the first dielectric layer is disposed between the first electrode layer and the first semiconductor layer, so as to form a capacitor between the first electrode layer and the first semiconductor layer.

Optionally, the second electrostatic protection circuit includes an electrostatic discharge circuit, and the electrostatic discharge circuit includes at least two thin film transistors; a control electrode of each of the at least two thin film transistors is electrically connected with second electrode thereof, and the at least two thin film transistors are electrically connected with each other in series; and the two thin film transistors at a distal end are electrically connected with a first voltage signal end and a second voltage signal end respectively; and a connection node is arranged between the corner of the wire and the electrostatic discharge circuit, at least one of the at least two thin film transistors is located between the connection node and the first voltage signal end, and at least one of the at least two thin film transistors is located between the connection node and the second voltage signal end.

Optionally, the second electrostatic protection circuit includes a second electrode layer, a second semiconductor layer and a third electrode layer; and the second semiconductor layer is disposed between the second electrode layer and the third electrode layer, so as to form the thin film transistors among the second electrode layer, the second semiconductor layer and the third electrode layer.

Optionally, the display substrate further includes a thin film transistor array, the thin film transistor array including a source-drain layer, an active layer, a second dielectric layer and a gate layer;

the first electrode layer and the gate layer are disposed in a same layer, the first semiconductor layer and the active layer are disposed in a same layer, and the first dielectric layer and the second dielectric layer are disposed in a same layer; or the second electrode layer and the gate layer are disposed in a same layer, the second semiconductor layer and the active layer are disposed in a same layer, and the third electrode layer and the source-drain layer are disposed in a same layer.

Optionally, the display substrate is a round display substrate; and the corners of the wire are arranged on two sides of the round display substrate, and the corners arranged on the two sides of the round display substrate are located on a same diameter of the round display substrate.

Optionally, the non-display area further includes: a first gate drive circuit, a multiplexer circuit, a fan-out area, a second gate drive circuit, a cell test circuit and a capacitor compensation circuit;

the non-display area include two portions, a first portion of the non-display area includes the first gate drive circuit, the multiplexer circuit and the fan-out area, and a second portion of the non-display area includes the second gate drive circuit, the cell test circuit and the capacitor compensation circuit;

the fan-out area is located outside the first gate drive circuit and the multiplexer circuit, and the capacitor compensation circuit is located inside the second gate drive circuit and the cell test circuit; and the corner of the wire are located at a junction of the first portion and the second portion.

Optionally, the corner is a zigzag corners.

Optionally, the electrostatic protection circuit is located at a blank position on the display substrate close to the corner.

Optionally, a plurality of wires having the corner are provided, and each of the plurality of wires having the corner is electrically connected with the electrostatic protection circuit.

Optionally, the display substrate is an organic light-emitting diode substrate.

The embodiment of the present disclosure provide a method for manufacturing a display substrate, where the display substrate includes a display area and a non-display area surrounding the display area, and the method includes:
  forming a wire having a corner in the non-display area; and
  forming at least one electrostatic protection circuit, where the electrostatic protection circuit is electrically connected with the wire at the corner, and the electrostatic protection circuit is configured to eliminate static electricity generated at the corner.

Optionally, the display area of the display substrate includes a thin film transistor array, and the electrostatic protection circuit includes a thin film transistor; and the method includes:
  simultaneously forming the thin film transistor array and the thin film transistor of the electrostatic protection circuit.

The embodiments of the present disclosure provide a display apparatus, including the display substrate provided in the embodiment of the present disclosure.

DETAILED DESCRIPTION OF THE EMBODIMENTS

To make objectives, technical solutions and advantages of the present disclosure clearer, the present disclosure will be further described in detail below in conjunction with particular embodiments and with reference to accompanying drawings.

It should be noted that unless otherwise defined, technical terms or scientific terms used in embodiments of the present disclosure should have ordinary meanings understood by those with ordinary skills in the field to which the present disclosure belongs. Words "first", "second", etc. used in the present disclosure do not denote any order, quantity, or importance, but are merely used to distinguish between different components. Words "include", "encompass" and the like are intended to mean that an element or item in front of the word encompasses elements or items that present behind the word and equivalents thereof, but does not exclude other elements or items. Words "connection", "connected" and the like are not limited to physical or mechanical connections, but can include an electrical connection in a direct or indirect manner. "Up", "down", "left", "right", etc. are merely used to indicate a relative position relation, which can also change accordingly when an absolute position of a described object changes.

A first aspect of the embodiments of the present disclosure provides a display substrate, which may solve the problem of electrostatic damage at corners of wires.

A display substrate provided in the embodiments of the present disclosure includes a display area and a non-display area surrounding the display area, where the non-display area includes a wire having a corner; and the display substrate further includes at least one electrostatic protection circuit, where the electrostatic protection circuit is electrically connected with the wire at the corner, and the electrostatic protection circuit is configured to eliminate static electricity generated at the corner.

In this way, the electrostatic protection circuit is electrically connected at the corner of the wire of the display substrate to eliminate the static electricity, and the problem of static electricity generated in the wire having the corner can be improved.

Optionally, the display substrate provided in the embodiments of the present disclosure may be an organic light-emitting diode (OLED) substrate.

Figure 1:
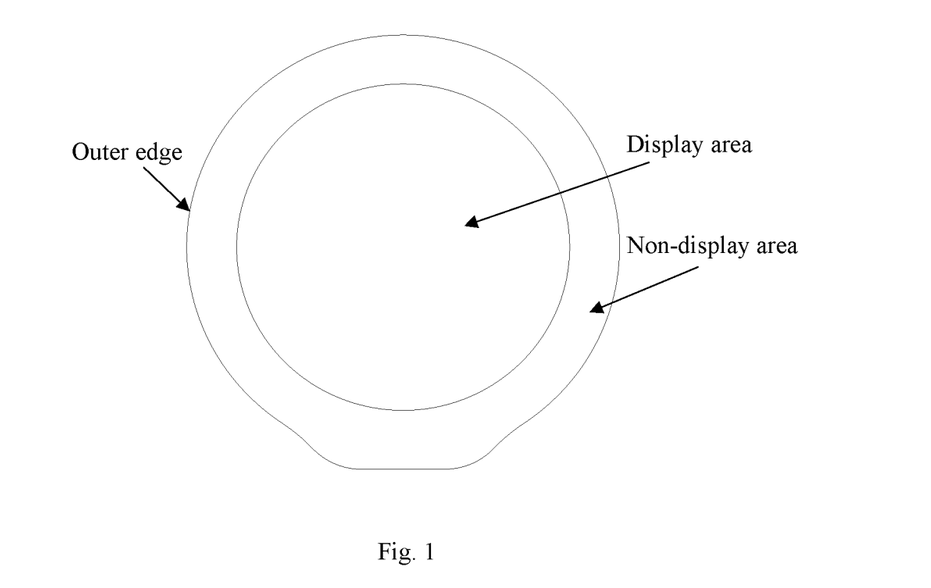
FIG. 1 is a schematic outline diagram of a round watch product.
Figure 2:
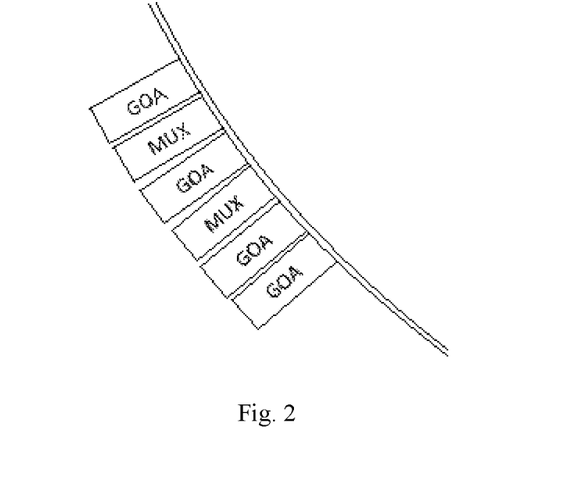
FIG. 2 is a schematic diagram for circular placement of a gate drive circuit (GOA) circuit and a multiplexer (MUX) circuit.
Figure 4:
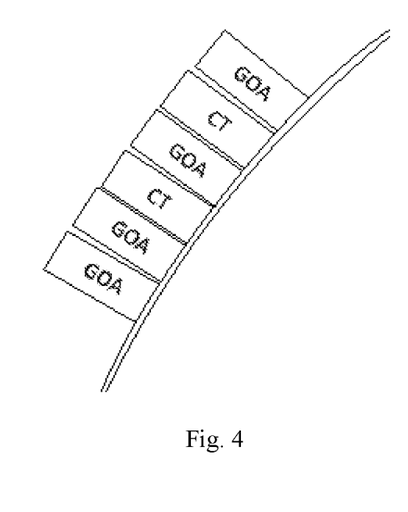
FIG. 4 is a schematic diagram for circular placement of a GOA circuit and a cell test (CT) circuit.

When designing a substrate circuit of a special-shaped screen product, especially a substrate circuit of a round screen, as shown in FIG. 1. A gate drive circuit (GOA) at an outer periphery of the display area (area AA) is usually circularly placed around an arc edge of the display area, as shown in FIGS. 2 and 4. Moreover, since one end (PAD end) of the round product connected with an external circuit is narrowed to a great extent and based on cost considerations, a multiplexer circuit (MUX) is often required to reduce a width of wires in a data signal wiring area (Fan-out area, area F for short) of the round product. According to a kind of design, the MUX circuit is circularly placed around the arc edge of the display area like the GOA circuit, as shown in FIG. 2. Therefore, a lower half of the non-display area mainly includes the GOA circuit and the MUX circuit which are circularly placed and the area F.

Figure 3:
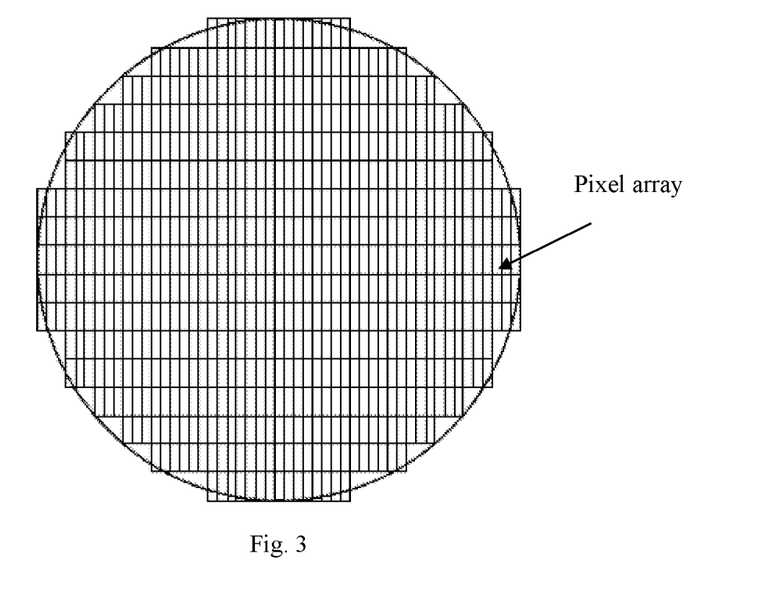
FIG. 3 is a schematic diagram of a display area pixel array of a round display apparatus.

Due to outline limitation of area AA of the round product, one kind of design is to form a pixel array as shown in FIG. 3. Such a pixel array has steps, leading to a difference of resistor-capacitor (RC) loading of data signals in different columns, especially a difference between data signals in a middle column and data signals in two sides. In this way, when a solid color picture with the same gray scale is displayed, there is obvious display non-uniformity between the two sides and the middle area. Therefore, one kind of design is to set a capacitor compensation circuit which is often placed in an upper half of the non-display area, as shown in FIG. 4. In addition, the cell test (CT) circuit, like the GOA circuit, is generally circularly arranged around the arc edge of the display area in the upper half, as shown in FIG. 4. Therefore, the upper half of the non-display area mainly includes the GOA circuit and the CT circuit which are circularly placed and the capacitor compensation circuit.

Figure 5:
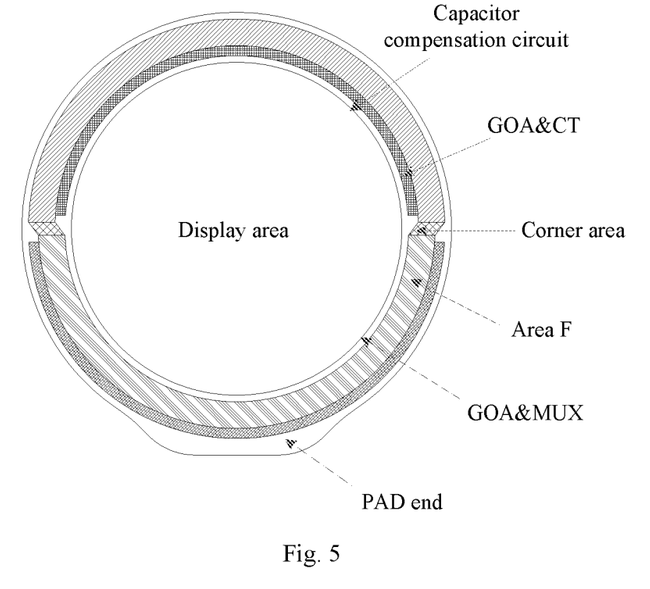
FIG. 5 is a schematic position diagram of all circuits of a round display apparatus.

Since the capacitor compensation circuit in the upper portion of the non-display area is directly connected with a data signal line, the capacitor compensation circuit needs to be placed adjacent to area AA, while area F in the lower portion needs to be placed outwards adjacent to the GOA circuit, so arc radii of the GOA circuits in the upper portion and the lower portions are different, as shown in FIG. 5.

Figure 6A:
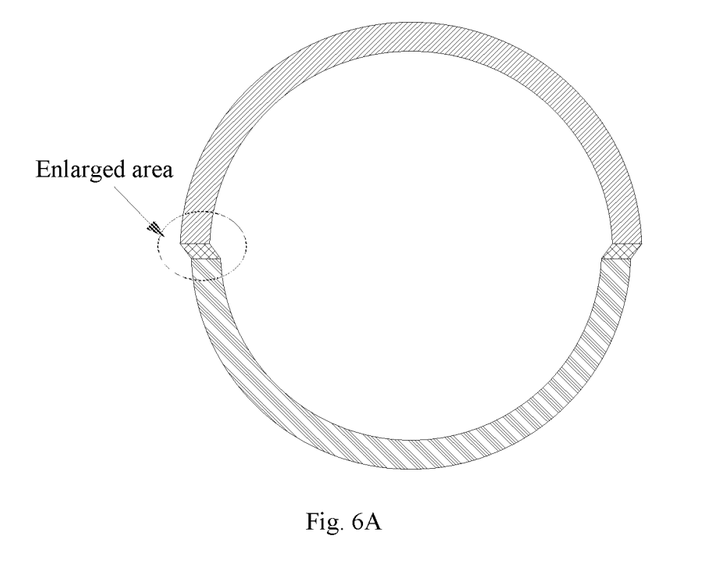
FIG. 6A is a schematic connection diagram of wires having corners.
Figure 6B:
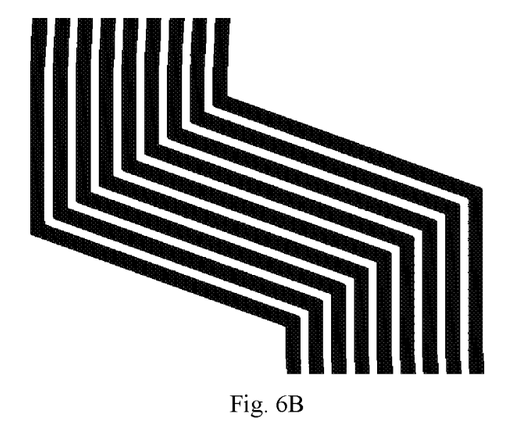
FIG. 6B is an enlarged schematic diagram of an enlarged area in FIG. 6A.

As shown in FIG. 5, in the case of round product design, left and right corner areas need to connect wires of GOA control signal lines and CT signal lines in the upper portion and the lower portion, as shown in FIGS. 6A and 6B. Since signals in the upper portion and the lower portion are uniformly transmitted along the circular arc, after the signals reach corners of the left side and the right side, static electricity is prone to accumulation at the corners due to long wires, resulting in static electricity damage.

Figure 7:
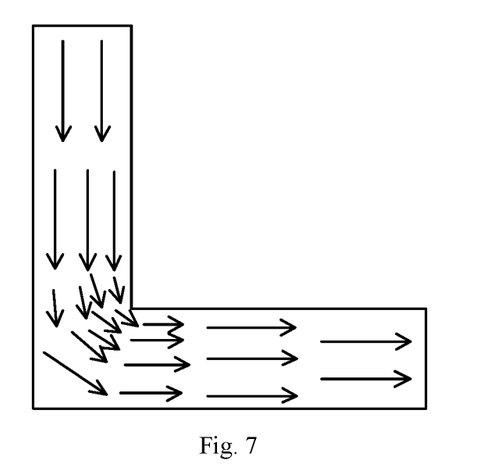
FIG. 7 is a schematic diagram of a current density in a corner area.

According to analysis based on a principle of a corner resistance, at this kind of corners, a current density inside the corners is high, and a current density outside the corners is low, as shown in FIG. 7. In addition, the left corner area and the right corner area are also key areas for electrostatic testing, and electrostatic damage is more likely to occur in the left and right corner areas during electrostatic testing. In addition, a lot of static electricity may be introduced due to factors such as technology, devices and environment during back plane technology, and electronic static discharge (ESD) damage often occurs in the left and right corner areas during a process of manufacturing the display substrate.

In view of this, a display substrate provided in the embodiments of the present disclosure includes a display area and a non-display area surrounding the display area, where the non-display area includes a wire having a corner; in a case that the display substrate is a round display substrate; and the corners of the wire are arranged on two sides of the round display substrate, and the corners arranged on two sides of the round display substrate are located on a same diameter of the round display substrate. The display substrate further includes at least one electrostatic protection circuit, where the electrostatic protection circuit is electrically connected with the wire at the corner, and the electrostatic protection circuit is configured to eliminate static electricity generated at the corners.

Optionally, as shown in FIG. 5, the non-display area may further include: a first gate drive circuit, a multiplexer circuit, a fan-out area, a second gate drive circuit, a cell test circuit and a capacitor compensation circuit;

the non-display area includes two portions, a first portion of the non-display area includes the first gate drive circuit, the multiplexer circuit and the fan-out area, and a second portion of the non-display area includes the second gate drive circuit, the cell test circuit and the capacitor compensation circuit;

the fan-out area is located outside the first gate drive circuit and the multiplexer circuit, and the capacitor compensation circuit is located inside the second gate drive circuit and the cell test circuit; and the corner of the wire is located at a junction of the first portion and the second portion.

Optionally, the electrostatic protection circuit 20 is arranged at a blank position on the display substrate close to the corner. As shown in FIG. 5, the blank position may be a blank on two sides of the corner area, such that on one hand space is saved and a narrow bezel effect is guaranteed, and on the other hand the electrostatic protection circuit is arranged close to the corners, so as to quickly achieve an electrostatic elimination effect.

Optionally, the corner may be a zigzag corner.

Optionally, a plurality of wires having the corner are provided, and each of the plurality of wires having the corner is electrically connected with the electrostatic protection circuit.

Figure 8:
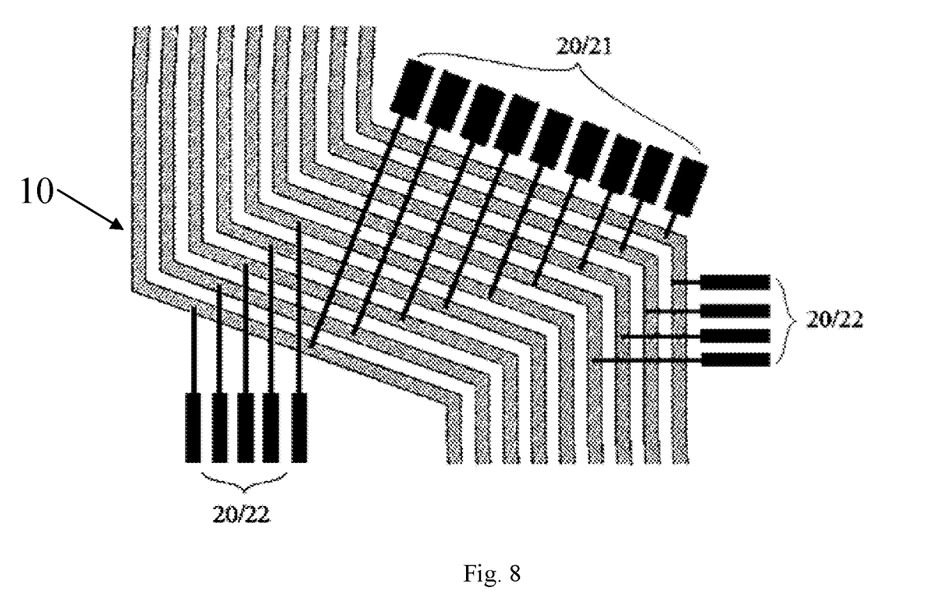
FIG. 8 is a schematic structural diagram in a corner region of a display substrate provided in an embodiment of the present disclosure.

With reference to FIGS. 1, 5 and 8, still another embodiment of a display substrate provided in the embodiments of the present disclosure may solve the problem of electrostatic damage at corners of wires.

A display substrate provided in the embodiments of the present disclosure includes a display area and a non-display area surrounding the display area, where the non-display area includes a wire 10 having a corner; and the display substrate further includes at least one electrostatic protection circuit 20, where the electrostatic protection circuit 20 is electrically connected with the wire 10 at the corner, and the electrostatic protection circuit is configured to eliminate static electricity generated at the corners.

In the embodiments of the present disclosure, the electrostatic protection circuit 20 may include at least one of:
a first electrostatic protection circuit 21 electrically connected with the wire 10 at the corner, and configured to eliminate the static electricity generated at the corner using a filter technology, so as to prevent electrostatic damage caused by factors such as technology, devices and environment during back plane technology; or
a second electrostatic protection circuit 22 electrically connected with the wire 10 at the corner, and configured to eliminate the static electricity generated at the corner according to a voltage regulation principle, so as to prevent static electricity damage generated during normal product use or static electricity testing.

As an optional embodiment, the display substrate includes the first electrostatic protection circuit 21 and the second electrostatic protection circuit 22. In this way, by arranging two kinds of electrostatic protection circuits at the same time, the electrostatic damage of the display substrate during a manufacturing process of the substrate technology and the electrostatic damage generated during the normal product use or static electricity testing may be avoided, and normal display by the products may be guaranteed.

In the embodiments of the present disclosure, the first electrostatic protection circuit 21 may include a resistor-capacitor filter circuit, and the resistor-capacitor filter circuit is configured to eliminate the static electricity generated at the corner using a resistor-capacitor filter technology. The electrostatic protection circuit has a simple structure and desirable electrostatic elimination effects.

Figure 9A:
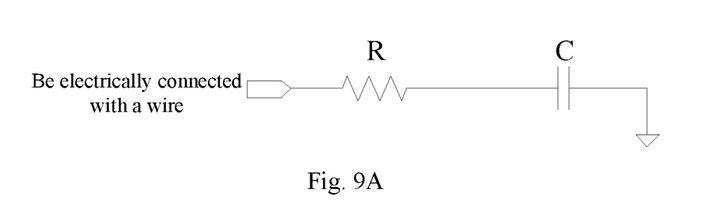
FIG. 9A is a schematic diagram of an equivalent circuit according to one embodiment of a first electrostatic protection circuit in an embodiment of the present disclosure.
Figure 9B:
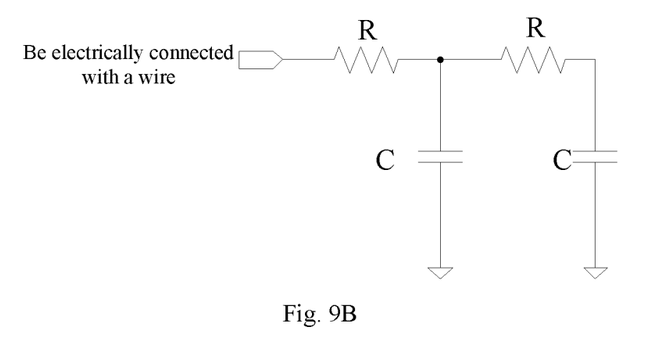
FIG. 9B is a schematic diagram of an equivalent circuit according to another embodiment of a first electrostatic protection circuit in an embodiment of the present disclosure.

In the embodiments of the present disclosure, as shown in FIG. 9A, the resistor-capacitor filter circuit includes a resistor R and a capacitor C; and a first end of the resistor R is electrically connected with the wire 10 at the corner, a second end of the resistor R is electrically connected with a first end of the capacitor C, and a second end of the capacitor C is floating or grounded. Generally, the resistor-capacitor filter circuit shown in FIG. 9A is a first-order RC filter circuit, and may be set to a second-order RC filter circuit or an $n^{th}$-order RC filter circuit as required. For example, in the case of the second-order RC filter circuit, the number of resistors and capacitors are both two, as shown in FIG. 9B.

Figure 9C:
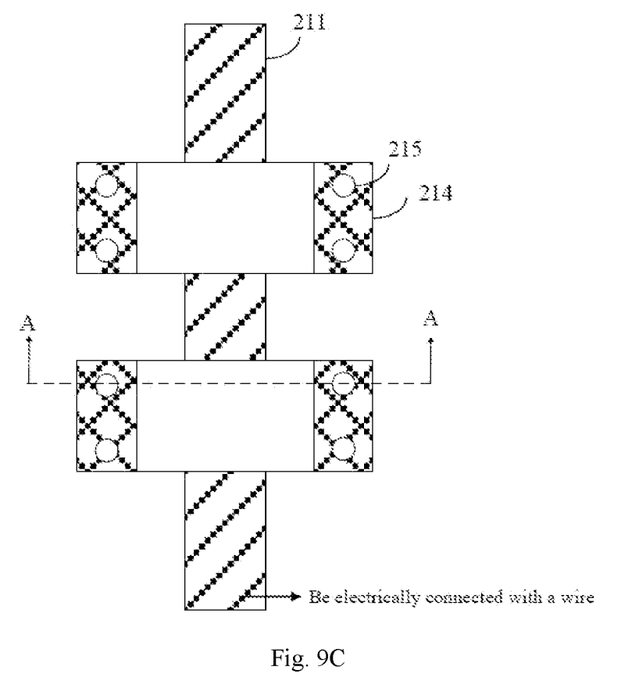
FIG. 9C is a schematic diagram of a plan view of a first electrostatic protection circuit in an embodiment of the present disclosure.
Figure 9D:
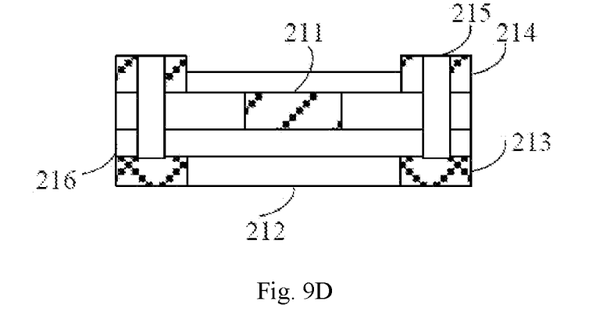
FIG. 9D is a schematic diagram of a sectional view in an AA direction in FIG. 9C.

In the embodiments of the present disclosure, as shown in FIGS. 9C and 9D, the first electrostatic protection circuit 21 includes a first electrode layer 211, a first dielectric layer 216 and a first semiconductor layer 212; and the first dielectric layer 216 is disposed between the first electrode layer 211 and the first semiconductor layer 212, so as to form a capacitor between the first electrode layer 211 and the first semiconductor layer 212.

As shown in FIGS. 9C and 9D, the first electrode layer 211, the first dielectric layer 216 and the first semiconductor layer 212 may be formed by using a thin film transistor (TFT) structure, and the first electrode layer 211 is a gate layer, the first dielectric layer 216 is an insulation layer and the first semiconductor layer 212 is an active layer. In this way, the first electrode layer 211 and the first semiconductor layer 212 are separated by the first dielectric layer 216, which is equivalent to a capacitor. In addition, the wire itself has a resistor, and the resistor may be equivalent to the resistor R in the RC filter circuit.

In addition, the first electrostatic protection circuit 21 may further include a fourth electrode layer 213 and a first metal block 214, and the first metal block 214 is electrically connected with the fourth electrode layer 213 through a first via hole 215. The fourth electrode layer 213 may be a source-drain layer of the thin film transistor, and the first metal block 214 may be floating or grounded state. In addition, if necessary, the first electrostatic protection circuit 21 may further include other dielectric layers, as shown in FIG. 9D.

In this way, by electrically connecting the first electrode layer 211 with the wire for receiving electrostatic signals, the first semiconductor layer 212 does not receive any signal, but keeps a floating or grounded state, such that each signal at the corner may enter the first electrostatic protection circuit 21 via the first electrode layer 211, thereby achieving electrostatic protection in the corner area. A protection principle is applied in such a way that main energy may be filtered out by using an RC filtering principle, so as to achieve electrostatic protection. When accumulated static electricity is strong, the first semiconductor layer 212 in the circuit may further be broken down to protect a nearby active circuit.

In addition, by designing the electrostatic protection circuit as a TFT structure, it is possible to manufacture the electrostatic protection circuit without increasing manufacturing processes when other TFTs in the display substrate are manufactured.

Figure 10A:
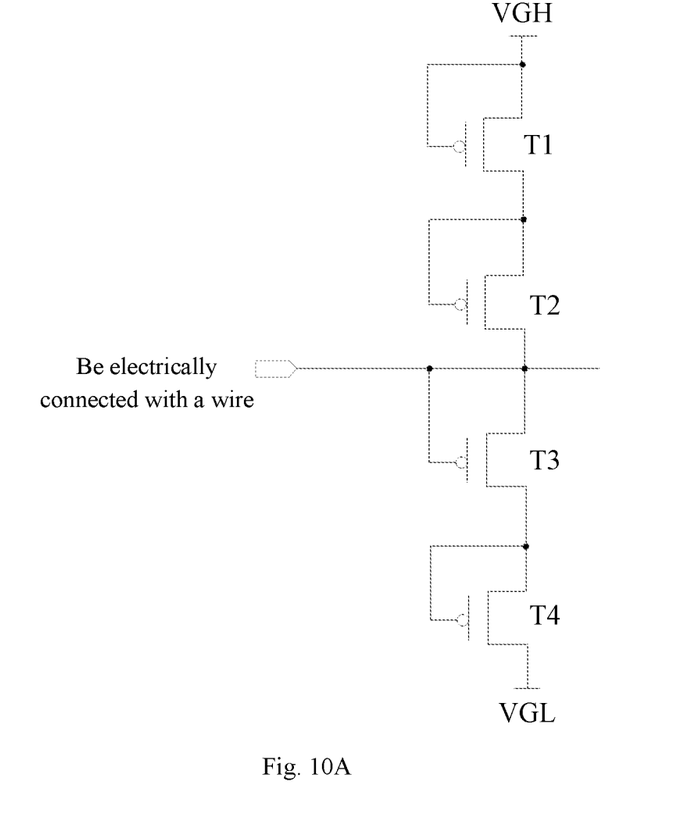
FIG. 10A is a schematic diagram of an equivalent circuit according to an embodiment of a second electrostatic protection circuit in an embodiment of the present disclosure.

In the embodiments of the present disclosure, as shown in FIG. 10A, the second electrostatic protection circuit 22 includes an electrostatic discharge circuit, the electrostatic discharge circuit includes at least two thin film transistors; a control electrode of each of the at least two thin film transistors is electrically connected with a second electrode thereof, and the at least two thin film transistors are connected with each other in series; and the two thin film transistors at a distal end are electrically connected with a first voltage signal end and a second voltage signal end respectively; and a connection node is arranged between the corner of the wire and the electrostatic discharge circuit, at least one the thin film transistors is located between the connection node and the first voltage signal end, and at least one the thin film transistors is located between the connection node and the second voltage signal end. The electrostatic discharge circuit has a simple structure and a desirable electrostatic elimination effect.

Optionally, according to different requirements, the electrostatic discharge circuit may include different quantities of thin film transistors. For example, unlike the structure shown in FIG. 10A, the electrostatic discharge circuit may merely include two or three thin film transistors. Only if it is guaranteed that at least one thin film transistor is arranged between the connection node and the first voltage signal end, and at least one thin film transistor is arranged between the connection node and the second voltage signal end, electrostatic discharge may be implemented. Similarly, more thin film transistors may be arranged, such as five, six or more.

Figure 10B:
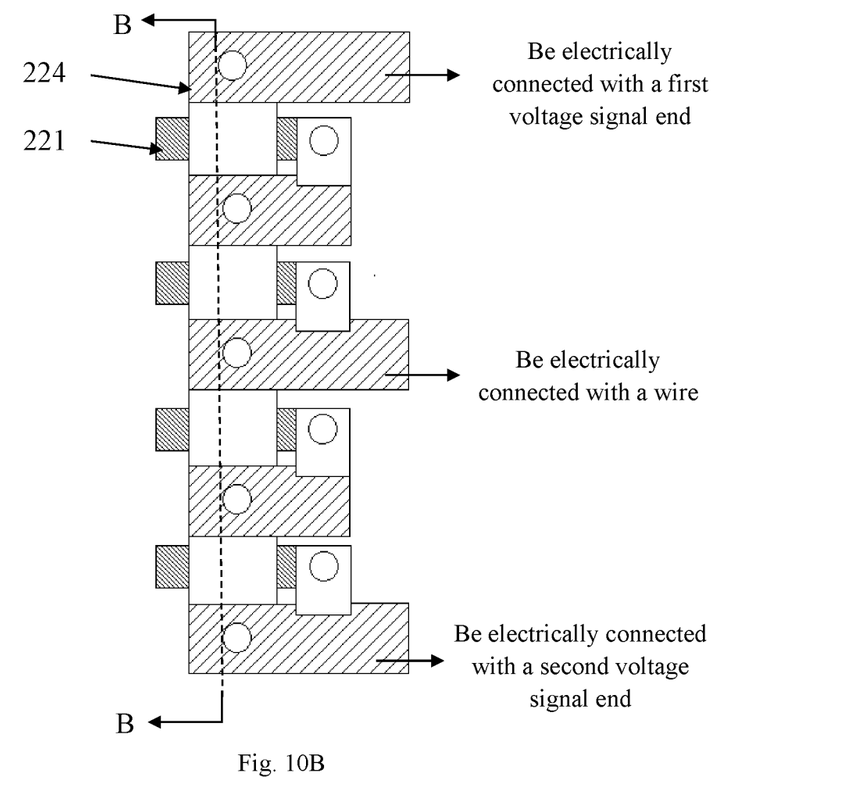
FIG. 10B is a schematic diagram of a plan view of a second electrostatic protection circuit in an embodiment of the present disclosure.
Figure 10C:
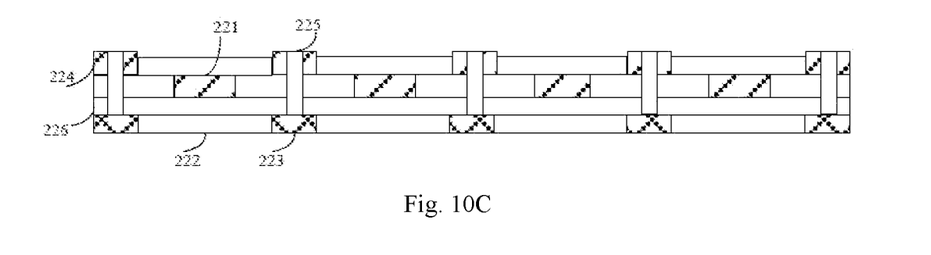
FIG. 10C is a schematic diagram of a sectional view in a BB direction in FIG. 10B.

In the embodiments of the present disclosure, as shown in FIGS. 10B and 10C, the second electrostatic protection circuit 22 includes a second electrode layer 221, a second semiconductor layer 222 and a third electrode layer 223; and the second semiconductor layer 222 is disposed between the second electrode layer 221 and the third electrode layer 223, so as to form the thin film transistors among the second electrode layer 221, the second semiconductor layer 222 and the third electrode layer 223. Optionally, the second electrostatic protection circuit 22 may further include a third dielectric layer 226 and a second metal block 224, and the second metal block 224 is electrically connected with the third electrode layer 223 through a first via hole 225. The second metal block 225 may be floating or grounded. In addition, if necessary, the second electrostatic protection circuit 22 may further include other dielectric layers, as shown in FIG. 10C.

With reference to FIG. 10A, a protection principle for the second electrostatic protection circuit 22 is as follows: when a high voltage is input, two TFTs (T1 and T2) electrically connected with a side of the first voltage signal end VGH are conducted, such that the high voltage is lowered by the first voltage signal end VGH, thereby eliminating the static electricity. When a very low voltage is input, two TFTs (T3 and T4) electrically connected with a side of the second voltage signal end VGL are conducted, such that the low voltage is raised by the second voltage signal end VGL, thereby eliminating the static electricity.

In addition, by designing the electrostatic discharge circuit as a TFT structure, it is possible to manufacture the electrostatic discharge circuit without increasing manufacturing processes when other TFTs in the display substrate are manufactured.

In the embodiments of the present disclosure, the display substrate further includes a thin film transistor array, the thin film transistor array including a source-drain layer, an active layer, a second dielectric layer and a gate layer;

the first electrode layer 211 and the gate layer are disposed in the same layer, the first semiconductor layer 212 and the active layer are disposed in the same layer, and the first dielectric layer 216 and the second dielectric layer are disposed in the same layer; or, the second electrode layer 221 and the gate layer are disposed in the same layer, the second semiconductor layer 222 and the active layer are disposed in the same layer, and the third electrode layer 223 and the source-drain layer are disposed in the same layer.

In this way, by designing the electrostatic protection circuit as a TFT structure, it is possible to manufacture the electrostatic protection circuit without increasing manufacturing processes when the thin film transistor array in the display substrate is manufactured.

In the embodiments of the present disclosure, aiming at the problem that the left area and the right area of the existing round OLED products are prone to ESD damage, a design idea that the ESD protection circuits need to be placed in the corner area is put forward, and two kinds of ESD protection circuits are used to avoid the electrostatic damage of the products during the manufacturing process of the display substrate technology, and the electrostatic damage generated during the normal product use or static electricity testing, so as to guarantee normal display by the products.

Figure 11:
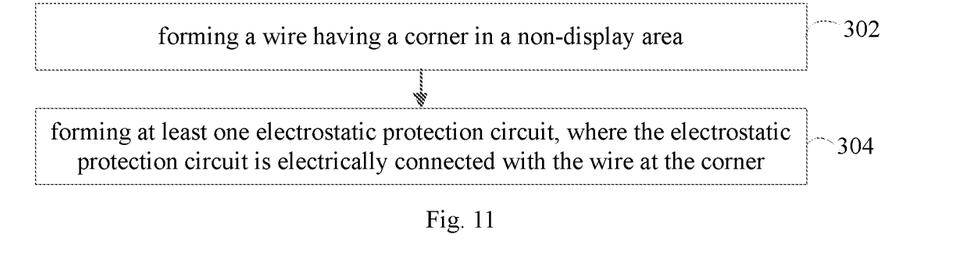
FIG. 11 is a schematic flowchart of a method for manufacturing a display substrate provided in an embodiment of the present disclosure.

FIG. 11 shows a schematic flowchart of a method for manufacturing a display substrate provided in the embodiments of the present disclosure.

The display substrate includes a display area and a non-display area surrounding the display area, and as shown in FIG. 11, and the method includes:
step 302: forming a wire having a corner in a non-display area; and
step 304: forming at least one electrostatic protection circuit, where the electrostatic protection circuit is electrically connected with the wire at the corner, and the electrostatic protection circuit is configured to eliminate static electricity generated at the corner.

In this way, the electrostatic protection circuit is electrically connected at the corner of the wire of the display substrate to eliminate the static electricity, and the problem of static electricity generated in the wires having the corners may be improved.

In the embodiments of the present disclosure, the display area of the display substrate includes a thin film transistor array, and the electrostatic protection circuit includes a thin film transistor; and the method includes:
simultaneously forming the thin film transistor array and the thin film transistor of the electrostatic protection circuit.

In the embodiments of the present disclosure, the thin film transistor array includes a source-drain layer, an active layer, a second dielectric layer and a gate layer, and the method includes:
forming a first electrode layer 211 and the gate layer simultaneously;
forming a first semiconductor layer 212 and the active layer simultaneously;
forming a first dielectric layer 216 and the second dielectric layer simultaneously;
forming a second electrode layer 221 and the gate layer simultaneously;
forming a second semiconductor layer 222 and the active layer simultaneously; and
forming a third electrode layer 223 and the source-drain layer simultaneously.

It should be noted that the above operations of layer formation include, but are not limited to, (chemical and physical vapor) film deposition and (magnetron) sputtering, and those skilled in the art can understand that after each layer is formed, corresponding patterns can be further formed on same as required, which is not repeated in detail in the present disclosure.

The embodiment of the present disclosure further provides a display apparatus. The display apparatus includes display substrates of arrangements and combinations in any embodiment or embodiments.

It should be noted that the display apparatus in the embodiments can be any product or component with a display function, such as E-paper, a mobile phone, a tablet computer, a television, a notebook, a digital photo frame and a navigator.

It should be noted that in the accompanying drawings, dimensions of the layers and areas may be exaggerated for clarity of illustration. Further, it can be understood that when an element or layer is referred to as being "on" another element or layer, it can be directly on the other element, or an intermediate layer can be present. In addition, it can be understood that when an element or layer is referred to as being "under" another element or layer, it can be directly under the other element or there can be more than one intermediate layer or element. In addition, it can also be understood that when a layer or element is referred to as being "between" two layers or elements, it can be the only layer between two layers or elements, or there can be more than one intermediate layer or element. Similar reference numerals indicate similar elements throughout the specification.

It should be understood by those skilled in the art that what are mentioned above are merely specific embodiments of the present disclosure, but not intended to limit the present disclosure, and any modification, equivalent replacement, improvement, etc. made within the spirit and principles of the present disclosure should fall within the scope of protection of the present disclosure.

What is claimed is:

1. A display substrate, comprising:
a display area;
a non-display area surrounding the display area, wherein the non-display area comprises a wire having a corner; and
at least one electrostatic protection circuit, wherein the electrostatic protection circuit is electrically connected with the wire at the corner, and the electrostatic protection circuit is configured to eliminate static electricity generated at the corner;
wherein the electrostatic protection circuit comprises at least one of:
a first electrostatic protection circuit configured to eliminate the static electricity generated at the corner using a filter technology; or
a second electrostatic protection circuit configured to eliminate the static electricity generated at the corner according to a voltage regulation principle;
wherein the first electrostatic protection circuit comprises a resistor-capacitor filter circuit, and the resistor-capacitor filter circuit is configured to eliminate the static electricity generated at the corner using a resistor-capacitor filter technology.

2. The display substrate according to claim 1, wherein the resistor-capacitor filter circuit comprises at least one resistor and at least one capacitor;
wherein, in a case that the resistor-capacitor filter circuit comprises one resistor and one capacitor, a first end of the resistor is electrically connected with the wire at the corner, a second end of the resistor is electrically connected with a first end of the capacitor, and a second end of the capacitor is floating or grounded.

3. The display substrate according to claim 2, wherein the first electrostatic protection circuit comprises a first electrode layer, a first dielectric layer and a first semiconductor layer;
- wherein the first dielectric layer is disposed between the first electrode layer and the first semiconductor layer, to form a capacitor between the first electrode layer and the first semiconductor layer.

4. The display substrate according to claim 3, further comprising a thin film transistor array, the thin film transistor array comprising a source-drain layer, an active layer, a second dielectric layer and a gate layer;
- the first electrode layer and the gate layer are disposed in a same layer, the first semiconductor layer and the active layer are disposed in a same layer, and the first dielectric layer and the second dielectric layer are disposed in a same layer; or
- the second electrode layer and the gate layer are disposed in a same layer, the second semiconductor layer and the active layer are disposed in a same layer, and the third electrode layer and the source-drain layer are disposed in a same layer.

5. The display substrate according to claim 1, wherein the second electrostatic protection circuit comprises an electrostatic discharge circuit, and the electrostatic discharge circuit comprises at least two thin film transistors; wherein a control electrode of each of the at least two thin film transistors is electrically connected with a second electrode of each of the at least two thin film transistors, and the at least two thin film transistors are electrically connected with each other in series; and two thin film transistors at a distal end are electrically connected with a first voltage signal end and a second voltage signal end respectively; and
- a connection node is arranged between the corner of the wire and the electrostatic discharge circuit, at least one of the at least two thin film transistors is located between the connection node and the first voltage signal end, and at least one of the at least two thin film transistors is located between the connection node and the second voltage signal end.

6. The display substrate according to claim 5, wherein the second electrostatic protection circuit comprises a second electrode layer, a second semiconductor layer and a third electrode layer;
- wherein the second semiconductor layer is disposed between the second electrode layer and the third electrode layer to form the thin film transistors among the second electrode layer, the second semiconductor layer and the third electrode layer.

7. The display substrate according to claim 6, further comprising a thin film transistor array, the thin film transistor array comprising a source-drain layer, an active layer, a second dielectric layer and a gate layer;
- the first electrode layer and the gate layer are disposed in a same layer, the first semiconductor layer and the active layer are disposed in a same layer, and the first dielectric layer and the second dielectric layer are disposed in a same layer; or
- the second electrode layer and the gate layer are disposed in a same layer, the second semiconductor layer and the active layer are disposed in a same layer, and the third electrode layer and the source-drain layer are disposed in a same layer.

8. The display substrate according to claim 1, wherein the display substrate is a round display substrate; and the corners of the wire are arranged on two sides of the round display substrate, and the corners arranged on the two sides of the round display substrate are located on a same diameter of the round display substrate.

9. The display substrate according to claim 8, wherein the non-display area further comprises: a first gate drive circuit, a multiplexer circuit, a fan-out area, a second gate drive circuit, a cell test circuit and a capacitor compensation circuit;
- the non-display area comprises two portions, a first portion of the non-display area comprises the first gate drive circuit, the multiplexer circuit and the fan-out area, and a second portion of the non-display area comprises the second gate drive circuit, the cell test circuit and the capacitor compensation circuit, wherein the fan-out area is located a side of the first gate drive circuit and the multiplexer circuit facing away from the display area, and the capacitor compensation circuit is located a side of the second gate drive circuit and the cell test circuit close to the display area; and the corner of the wire is located at a junction of the first portion and the second portion.

10. The display substrate according to claim 8, wherein the corner is a zigzag corner.

11. The display substrate according to claim 8, wherein the electrostatic protection circuit is located at a blank position on the display substrate close to the corner.

12. The display substrate according to claim 1, wherein a plurality of wires having the corner are provided, and each of the plurality of wires having the corner is electrically connected with the electrostatic protection circuit.

13. The display substrate according to claim 1, wherein the display substrate is an organic light-emitting diode substrate.

14. A method for manufacturing the display substrate according to claim 1, comprising:
- forming the wire having the corner in the non-display area; and
- forming the at least one electrostatic protection circuit.

15. The method for manufacturing a display substrate according to claim 14, wherein the display area of the display substrate comprises a thin film transistor array, and the electrostatic protection circuit comprises a thin film transistor; and the method comprises:
- simultaneously forming the thin film transistor array and the thin film transistor of the electrostatic protection circuit.

16. A display apparatus, comprising the display substrate according to claim 1.

17. A display substrate, comprising:
- a display area;
- a non-display area surrounding the display area, wherein the non-display area comprises a wire having a corner; and
- at least one electrostatic protection circuit, wherein the electrostatic protection circuit is electrically connected with the wire at the corner, and the electrostatic protection circuit is configured to eliminate static electricity generated at the corner;
- wherein the electrostatic protection circuit comprises:
  - a second electrostatic protection circuit configured to eliminate the static electricity generated at the corner according to a voltage regulation principle;
- wherein the second electrostatic protection circuit comprises an electrostatic discharge circuit, and the electrostatic discharge circuit comprises at least two thin film transistors; wherein a control electrode of each of the at least two thin film transistors is electrically connected with a second electrode of each of the at least two thin film transistors, and the at least two thin film transistors are electrically connected with each other in series; and two thin film transistors at a distal end are electrically connected with a first voltage signal end and a second voltage signal end respectively; and a connection node is arranged between the corner of the wire and the electrostatic discharge circuit, at least one of the at least two thin film transistors is located between the connection node and the first voltage signal end, and at least one of the at least two thin film transistors is located between the connection node and the second voltage signal end.

18. The display substrate according to claim 17, wherein the second electrostatic protection circuit comprises a second electrode layer, a second semiconductor layer and a third electrode layer;

wherein the second semiconductor layer is disposed between the second electrode layer and the third electrode layer to form the thin film transistors among the second electrode layer, the second semiconductor layer and the third electrode layer.

19. The display substrate according to claim 18, further comprising a thin film transistor array, the thin film transistor array comprising a source-drain layer, an active layer, a second dielectric layer and a gate layer;

the first electrode layer and the gate layer are disposed in a same layer, the first semiconductor layer and the active layer are disposed in a same layer, and the first dielectric layer and the second dielectric layer are disposed in a same layer; or the second electrode layer and the gate layer are disposed in a same layer, the second semiconductor layer and the active layer are disposed in a same layer, and the third electrode layer and the source-drain layer are disposed in a same layer.

20. A display substrate, comprising:

a display area;

a non-display area surrounding the display area, wherein the non-display area comprises a wire having a corner; and at least one electrostatic protection circuit, wherein the electrostatic protection circuit is electrically connected with the wire at the corner, and the electrostatic protection circuit is configured to eliminate static electricity generated at the corner;

wherein the display substrate is a round display substrate; and the corners of the wire are arranged on two sides of the round display substrate, and the corners arranged on the two sides of the round display substrate are located on a same diameter of the round display substrate.

* * * * *